(12) United States Patent
Voldman

(10) Patent No.: US 7,671,423 B2
(45) Date of Patent: Mar. 2, 2010

(54) RESISTOR BALLASTED TRANSISTORS

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 11/971,962

(22) Filed: Jan. 10, 2008

(65) Prior Publication Data
US 2009/0179276 A1 Jul. 16, 2009

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .............. 257/369; 257/274; 257/E27.062; 438/155; 438/158

(58) Field of Classification Search ................. 257/274, 257/369, E27.062, E27.067; 438/155, 188
See application file for complete search history.

(56) References Cited

U.S. PATENT DOCUMENTS 5,374,844 A * 12/1994 Moyer ........................ 257/582
6,740,936 B1 * 5/2004 Gitlin et al. .................. 257/363
7,087,973 B2 * 8/2006 Mallikarjunaswamy et al. .......................... 257/493
2007/0207600 A1 9/2007 You et al.
2007/0246771 A1 10/2007 McCormack et al.

* cited by examiner

*Primary Examiner*—Phuc T Dang
(74) *Attorney, Agent, or Firm*—Gibb I.P. Law Firm, LLC; W. Riyon Harding, Esq.

(57) ABSTRACT

A semiconductor chip comprises low voltage complementary metal oxide semiconductor (CMOS) sectors and high voltage lateral double diffused metal oxide semiconductor (LDMOS) sectors and at least one transistor within at least one of the low voltage CMOS sectors. The transistor has a semiconducting channel region within a substrate. A gate conductor is above the top layer of substrate, and the gate conductor is positioned above the channel region. A source/drain region is included in the substrate on a first side of the gate conductor and a lateral source/drain region is included in the substrate on a second side of the gate conductor opposite the first side. The lateral source/drain region is positioned a greater distance from the gate conductor than the source/drain region is positioned from the gate conductor. The embodiments herein also include a source/drain ballast resistor in the substrate between the lateral source/drain region and the gate conductor.

20 Claims, 16 Drawing Sheets

RESISTOR BALLASTED TRANSISTORS

BACKGROUND

FIELD OF THE INVENTION

The invention generally relates to semiconductor transistors and more particularly to low voltage field effect transistors that utilize high voltage lateral drain doping regions as ballast resistors to allow low voltage designs to accommodate higher voltages.

SUMMARY

Embodiments herein provide a semiconductor chip that comprises low voltage complementary metal oxide semiconductor (CMOS) sectors and high voltage lateral double diffused metal oxide semiconductor (LDMOS) sectors and at least one transistor within at least one of the low voltage CMOS sectors. These low voltage CMOS transistors have a semiconducting channel region within a substrate. A gate conductor is above the top layer of substrate, and the gate conductor is positioned above the channel region. A source region is included in the substrate on a first side of the gate conductor and a lateral drain region is included in the substrate on a second side of the gate conductor opposite the first side. The lateral drain region is positioned a greater distance from the gate conductor than the source region is positioned from the gate conductor. The embodiments herein also include a drain ballast resistor in the substrate between the lateral drain region and the gate conductor.

In some embodiments, the drain ballast resistor comprises a body region having a same doping polarity type as the lateral drain region. In some embodiments herein, the drain ballast resistor electrically connects the lateral drain region and the channel region.

In other embodiments, a standard field effect transistor (FET) drain (which is sometimes referred to as a "first drain region" to distinguish the standard drain from the lateral drain region) is positioned in the substrate on the second side of the gate conductor. In some embodiments, the ballast resistor electrically connects the lateral drain region to the first drain region. In addition, a shallow trench isolation region can be positioned between the lateral drain region and the first drain region to isolate the two structures.

Thus, with embodiments herein, the gate conductor, the channel region, the source region, and the first drain region form either an asymmetric field effect transistor or a symmetric field effect transistor. The lateral drain region and the drain ballast resistor are unique additions to such field effect transistor structures. With the symmetric field effect transistor, the first drain region is positioned the same distance from the gate conductor as the source region is positioned from the gate conductor. With the asymmetric field effect transistor, the first drain region is positioned a different distance from the gate conductor than the source region is positioned from the gate conductor.

Other embodiments use deeper implant regions as part of the drain ballast resistor structure. For example, some embodiments herein utilize well or tub regions below the body regions. Thus, some embodiments include a shallow well region below the first drain region. The shallow well region has the same doping polarity type as the lateral drain region and the first drain region. An opposite doped well region is positioned below the shallow well region. As the name suggests, the opposite doped well region has an opposite doping polarity type when compared to the lateral drain region. A deep-well region (which is sometimes referred to herein as a "tub" region) is positioned below the opposite doped well region. The deep-well region has the same doping conductivity type as the lateral drain region. In some embodiments, the lateral drain region is electrically connected to the deep-well region and in these embodiments, the lateral train region actually forms part of a tub contact. Therefore, embodiments herein integrate lateral double diffused metal oxide semiconductor (LDMOS) deep tub implants into a low voltage CMOS MOSFET structure.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
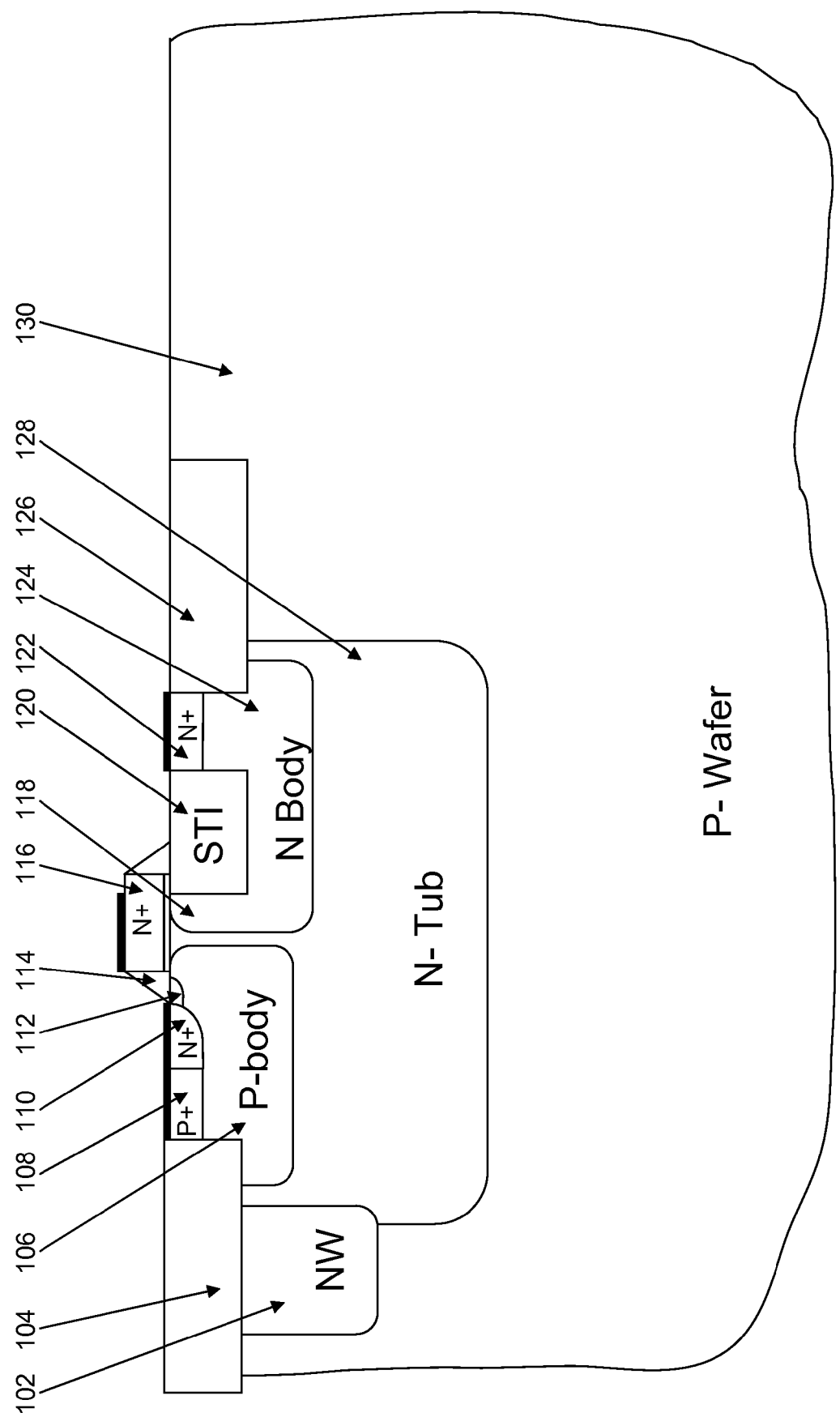
FIG. 1 is schematic diagram of a transistor structure according to embodiments herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

In high voltage complementary metal oxide semiconductor (HVCMOS) transistors, there is a need for electrostatic discharge (ESD) protection at, for example, 2 kV, 4 kV and 8 kV protection levels. Electrostatic discharge protection is important, for example, in auto industry applications which can present stringent requirements and current reversal problems. Therefore, solutions are needed for ESD protection of low voltage complementary metal oxide semiconductor (CMOS) devices used in HVCMOS technologies including, for example, 120 V, 40 V, 25 V and 20 V applications.

In order to address such issues, the present embodiments utilize lateral double diffused metal oxide semiconductor (LDMOS) HVCMOS implants within low voltage CMOS circuitry to create metal oxide semiconductor field effect transistor (MOSFET) driver circuits or MOSFET-based ESD networks. Thus, embodiments herein integrate LDMOS HVCMOS wells, and drift region implants into standard MOSFET structures as ballasting elements for ESD and input/output (I/O) networks. The LDMOS drift region implants are used as ballast resistors for both n-channel and p-channel MOSFETs.

As shown in greater detail below, the ballast resistor elements can be LDMOS surface shallow N-type (SN) or shallow P-type (SP) implants (e.g., that are positioned below the shallow trench isolation (STI) edge); N-type or P-type LDMOS drift region implant (again, below the STI edge); and/or LDMOS deep N-type wells (which are sometimes referred to herein as "N-tub" or deep N (DN) implants) as well as similar P-type wells (P-tub or deep P (DP) implants). Such different embodiments can be used independently or in any combination. One feature of embodiments herein is the integration of LDMOS deep tub implants into a low voltage CMOS MOSFET transistors. This allows the resulting structures to be used as, for example, driver and receiver networks; and/or driver ballast resistors. Similarly, the embodiments herein can be utilized for ESD networks, and can be integrated into N-type field effect transistor (NFET) or P-type field effect transistor (PFET) power clamps; and/or grounded gate N or P-type MOSFET networks (GGNMOS or GGPMOS).

Figure 15:
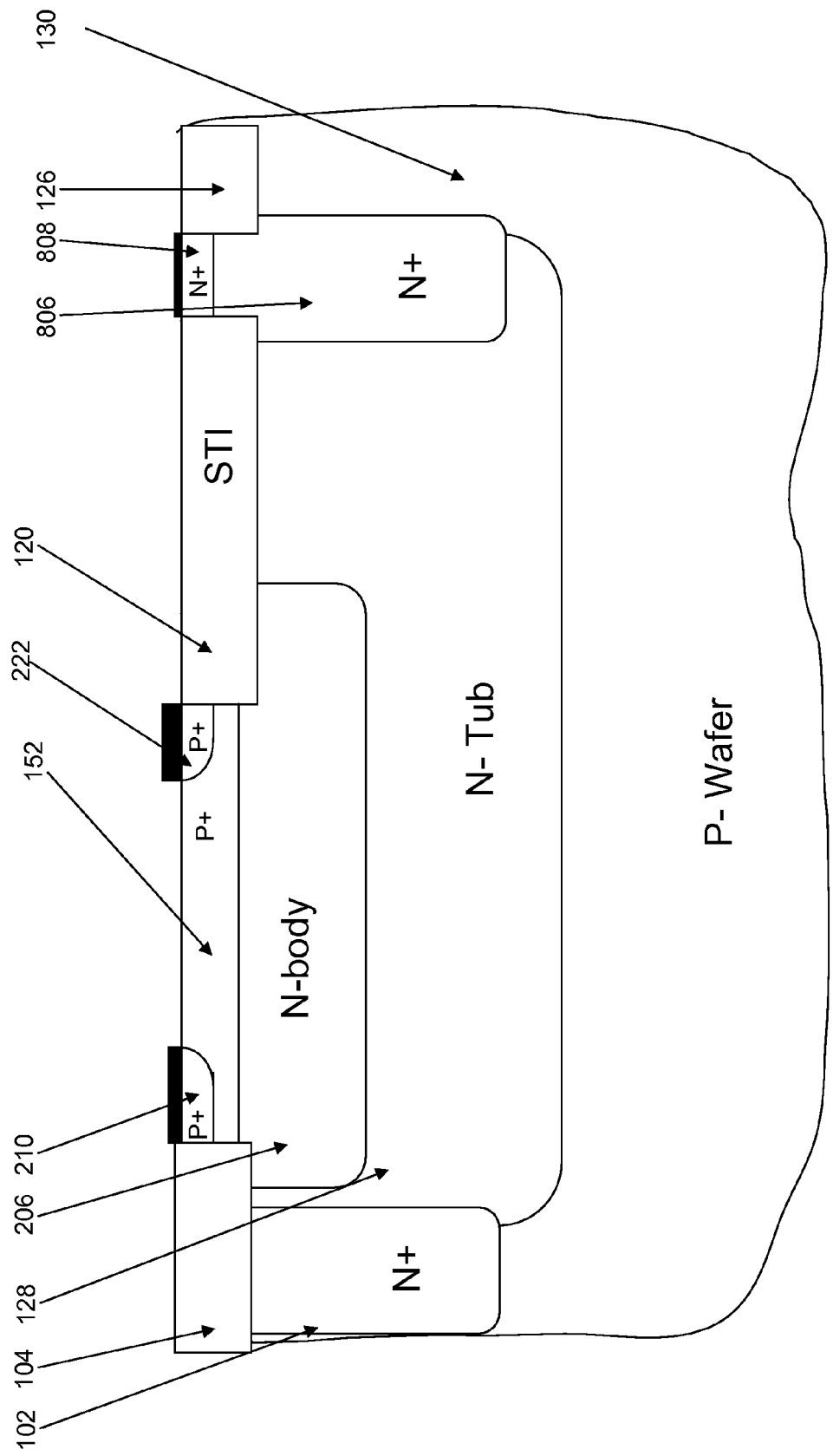
FIG. 15 is schematic diagram of a transistor structure according to embodiments herein.
Figure 16:
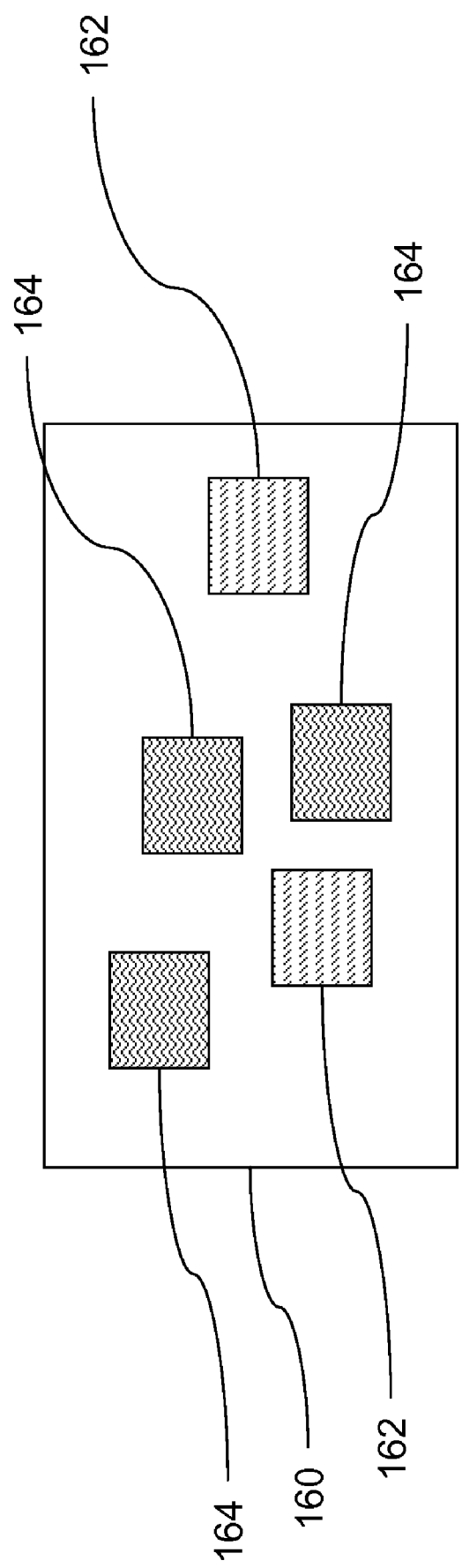
FIG. 16 is schematic diagram of a transistor structure according to embodiments herein.

More specifically, as shown in FIG. 16, the LDMOS tub implants are used as ballast resistors in low voltage CMOS transistors where there are both low voltage CMOS chip sectors 162 (which use CMOS circuitry and CMOS transistors) and where there are also high voltage chip sectors 164 (that use LDMOS transistors) on the same semiconductor chip 160. For example, the high voltage chip sectors 164 would operate at voltages above 120 Volts down to approximately 10 Volts and the low the voltage chip sectors 162 would operate at voltages below 1 Volt up to approximately 10 Volts. Therefore, FIG. 16 illustrates a semiconductor chip 160 comprising low voltage CMOS sectors 162 and high voltage LDMOS sectors 164 and FIGS. 1-15 illustrate various transistors that are to be positioned within the low voltage CMOS sectors 162. Note that FIG. 16 is schematic in nature and only generally illustrates the low voltage chip sectors 162 and the high voltage chip sectors 164 and one ordinarily skilled in the art would understand that such sectors could be of any size and at any location on the chip 160. Further, the low and high voltage sectors 162, 164 could be positioned within different levels of the chip and could be directly adjacent to one another, or separated from one another by relatively large spacings.

Thus, as shown FIGS. 1-15, embodiments herein provide a transistor structure that includes a field effect transistor (110, 116, 122). Note that in the following examples, the source and drain regions can be substituted for one another, but that for simplicity of explanation, the ballast resistor is described as being connected to the drain in the following examples. Those ordinarily skilled in the art would understand that a mirror structure could apply to each of the following structures, and that the ballast resistor could connect to the source in place of the drain in each of the following examples.

More specifically, as shown in FIG. 1, the field effect transistor has a semiconducting channel region 118 within a P-wafer substrate 130. A gate conductor 116 is above the top layer of substrate 130, and the gate conductor 116 is positioned above the channel region 118. In the embodiment shown in FIG. 1, the gate conductor 116 comprises an N-type polarity doping. Further, the gate stack includes an underlying gate oxide and sidewall spacers 114.

A source region 110 is included in the substrate 130 on a first side of the gate conductor 116 and a lateral drain region 122 is included in the substrate 130 on a second side of the gate conductor 116 opposite the first side. Source/drain extensions are shown in the drawings as items 112.

In the embodiment shown in FIG. 1, both the gate conductor 116 and the lateral drain region 122 have the same doping polarity (N-type) as the gate conductor 116. The lateral drain region 122 is positioned a greater distance from the gate conductor 116 than the source region 110 is positioned from the gate conductor 116.

FIG. 1 further illustrates N polarity doped regions; a well (N-well) 102 and a deeper tub (N-tub) 128. One feature of embodiments herein is that the tub implants 128 are LDMOS diffused well implants as opposed to the standard low voltage CMOS wells 106, 124, etc. which are implanted. The LDMOS diffused well implants use very different doses and energy levels. LDMOS implants are diffused because of the need to provide drop voltage across a physical structure as well as high breakdown. Diffused well implants provide a means of voltage drops through a structure. In the diffused well, the saturation velocity of electrons is exceeded, leading to a current limiting response. With current limitation, as the voltage is increased, a larger voltage drop occurs. In addition, a second feature is the need to provide high breakdown voltages. In implanted wells, large voltage gradients occur due to the abruptness of the implanted doping profile. In diffused wells, the doping profile is gradual, leading to high breakdown voltages at the metallurgical junctions between wells, and well-to-substrate junctions.

Opposite polarity P-type doped regions 106 (P-body) and 108 are also illustrated as being positioned under and next to the source region 110. Shallow trench isolation regions are illustrated generally as items 104, 120, and 126. Thus, as shown, the embodiments herein integrate LDMOS deep tub implants into a low voltage CMOS MOSFET structure.

As shown in FIG. 1, some embodiments herein also include a drain ballast resistor 124 in the substrate 130 between the lateral drain region 122 and the gate conductor 116. In the embodiment show in FIG. 1, the drain ballast resistor 124 comprises a body region having the same doping polarity type as the lateral drain region 122. Also, in the embodiment shown in FIG. 1, the drain ballast resistor 124 electrically connects the lateral drain region 122 and the channel region 118. The embodiment shown in FIG. 1 can include the channel region 118 within the N-body 124.

In FIG. 1, the resistor 124 protects the transistor and allows the transistor to have substantially improved ESD protection and substantially higher voltage capability. Therefore, by including LDMOS HVCMOS wells, and drift region implants into standard MOSFET structures, such transistors are made substantially more robust allowing such transistors to be used as power driver circuits and as ESD protection input/output devices. While FIG. 1 illustrates one embodiment that can be used as a level shift N-type LDMOS (ND-MOS), other configurations are also possible. For example FIG. 2, discussed below, illustrates a level shift P-type LDMOS (PDMOS).

Those ordinarily skilled in the art would understand that many different methods of deposition (chemical vapor deposition (CVD), plasma vapor deposition (PVD), etc.) and patterning (etching, photolithography, etc.) and other feature formation techniques (damascene, polishing, etc.) could be used with a number of different materials (silicon, polysilicon, oxides, doping agents, etc.) to form the structure shown in FIG. 1, and that the embodiments herein are applicable to all such techniques, whether now known or developed in the future. As some concrete examples, U.S. Pat. No. 7,087,973 and U.S. Patent Publications 2007/0246771 and 2007/0207600 (which are fully incorporated herein by reference) disclose a few known techniques for forming such devices.

Figure 2:
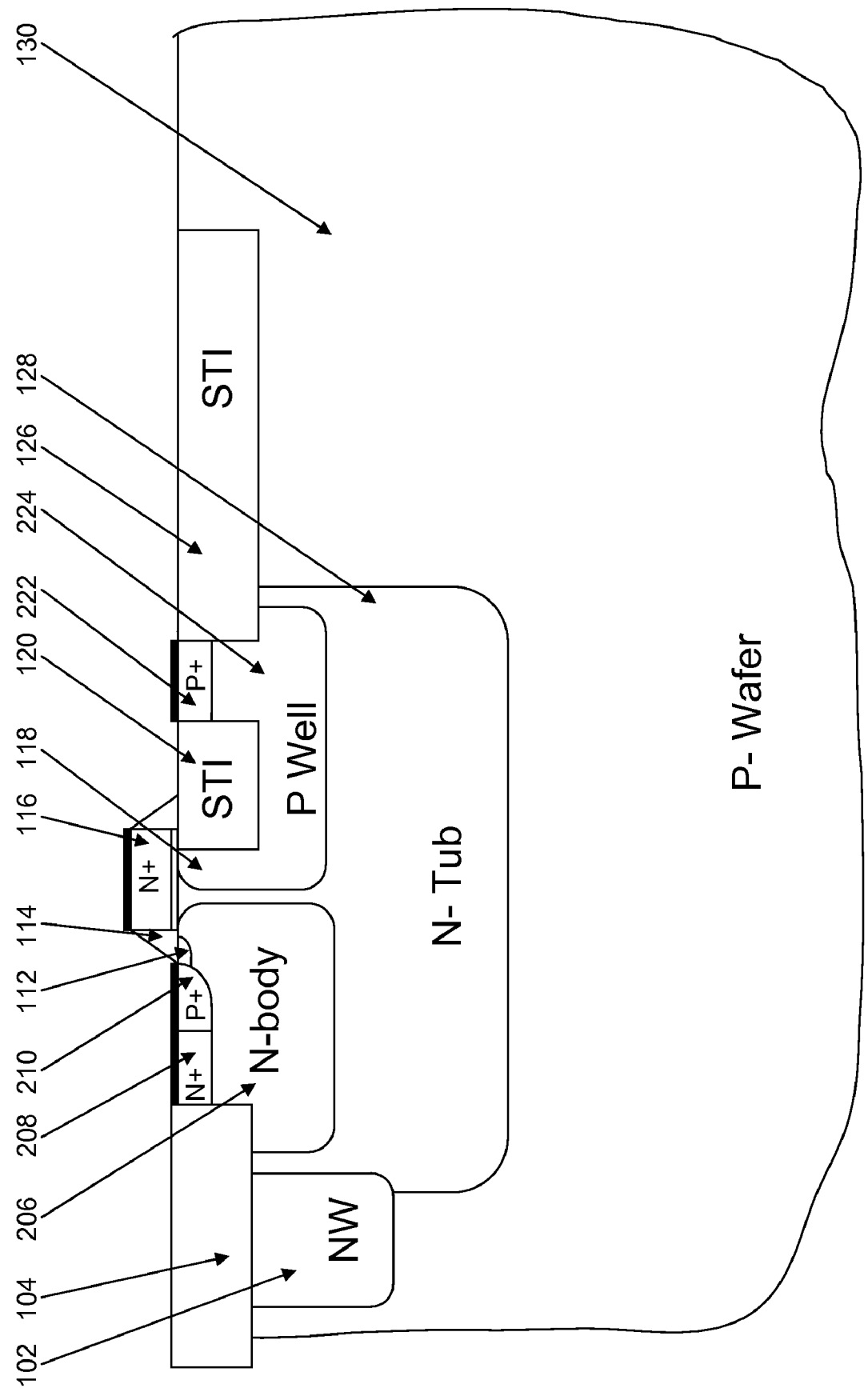
FIG. 2 is schematic diagram of a transistor structure according to embodiments herein.

The structure shown in FIG. 2 is similar to that shown in FIG. 1 and the same numbers are used to identify the same features (as is true with the remaining drawings also); however, the structure in FIG. 2 is an opposite polarity transistor (e.g., a P-type transistor (PDMOS)) and therefore, includes N-body regions 206, 208 and P-doped regions 210, 222, 224 in place of corresponding opposite polarity regions shown in FIG. 1.

Figure 3:
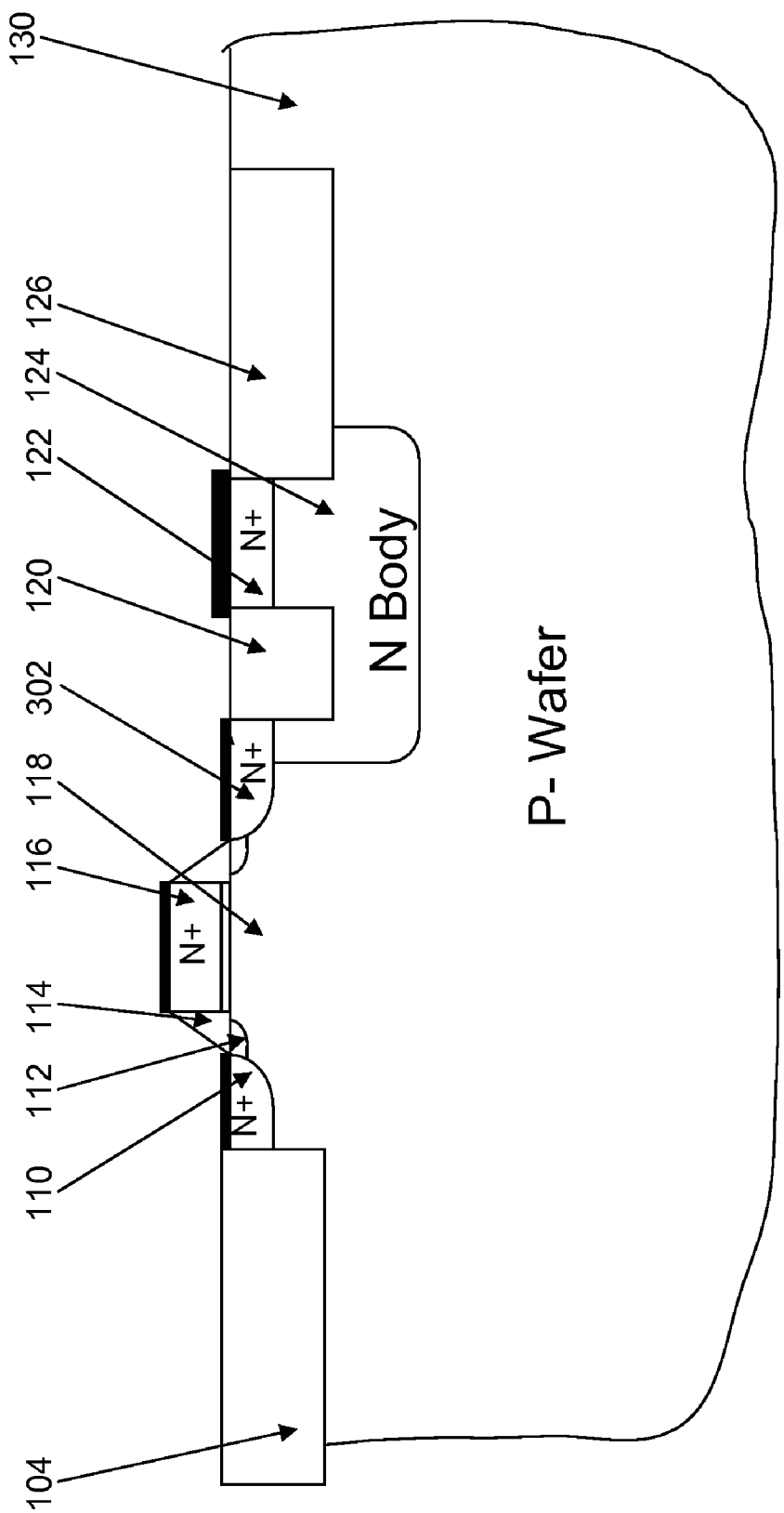
FIG. 3 is schematic diagram of a transistor structure according to embodiments herein.

FIG. 3 illustrates another embodiment, that is similar to the embodiment shown in FIG. 1, but that also includes a standard field effect transistor (FET) drain 302 (which is sometimes referred to as a "first drain region 302" to distinguish the standard drain from the lateral drain region 122). The first drain region 302 is positioned in the substrate 130 on the drain (second) side of the gate conductor 116.

In the embodiment shown in FIG. 3, the ballast resistor 124 electrically connects the lateral drain region 122 to the first drain region 302. In addition, the shallow trench isolation region 120 is positioned between the lateral drain region 122 and the first drain region 302 to isolate these two structures. To the contrary, similar conventional structures can only use a lightly doped drain (LDD) structure in this location, while the embodiments herein use STI for superior performance ballast resistor that corresponds to LDMOS technology.

Thus, with the embodiment shown in FIG. 3, the gate conductor 116, the channel region 118, the source region 110, and the first drain region 302 form a symmetric field effect transistor. With the symmetric field effect transistor, the first drain region 302 is positioned the same distance from the gate conductor 116 as the source region 110 is positioned from the gate conductor 116. In a symmetric transistor, the source and drain regions is the low voltage CMOS transistor drain engineering and CMOS device characteristics do not need re-optimization. With the addition of the shallow trench isolation 120, and the well region 124, the voltage can be dropped across the LDMOS implant, introducing resistor ballasting and current limitation through the physical structure. The LDMOS well implant region 124 serves as a means of current limitation through the low voltage CMOS device.

Figure 4:
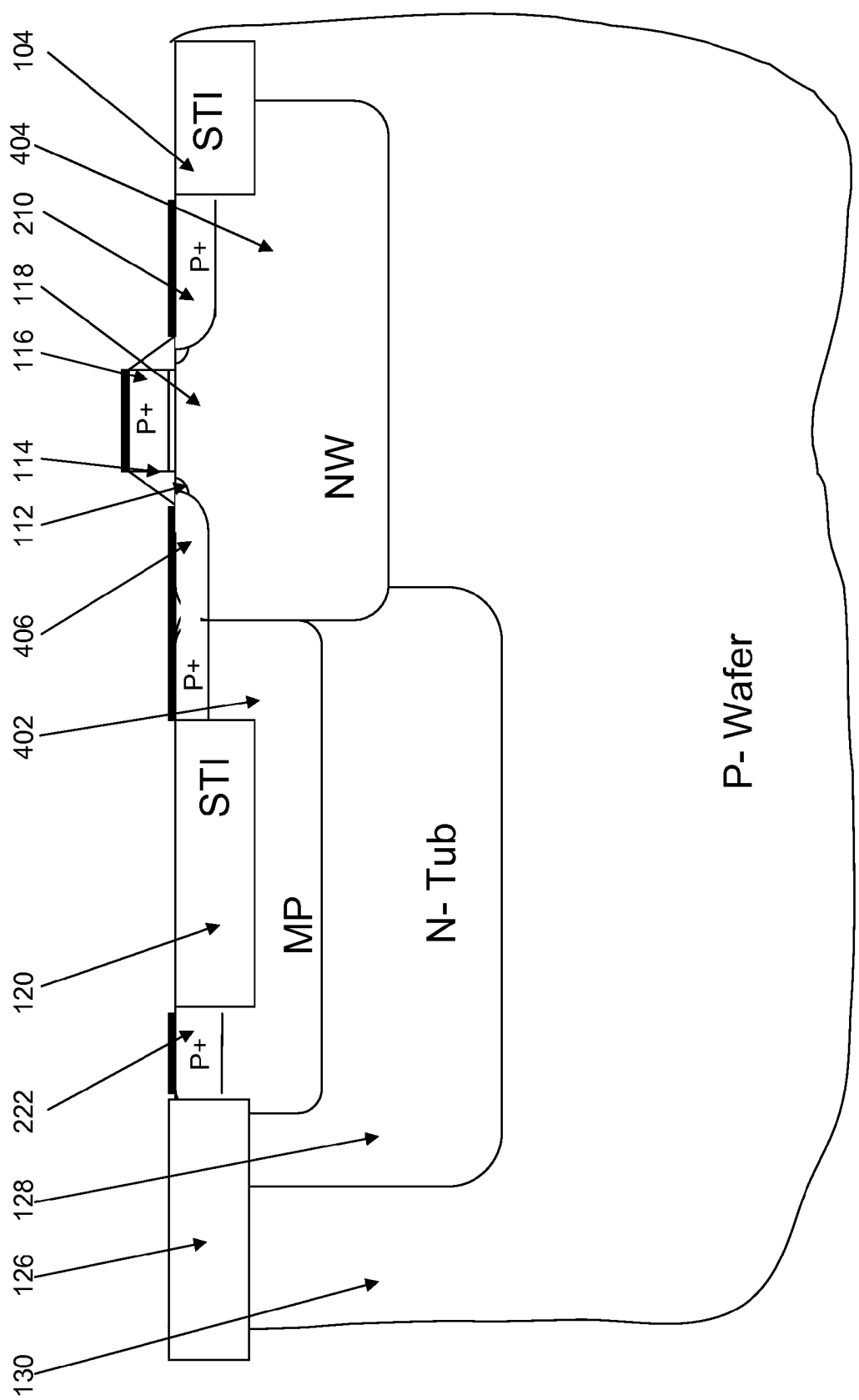
FIG. 4 is schematic diagram of a transistor structure according to embodiments herein.

Other embodiments use deeper implant regions as part of the drain ballast resistor 124 structure. For example, some embodiments herein utilize well or tub regions below the body regions, such as shown in FIG. 4. The structure shown in FIG. 4 is similar to the resistor ballasted MOSFET shown in FIG. 3. However, the structure in FIG. 3 is an opposite polarity transistor (e.g., a P-type transistor (PDMOS)) and therefore, includes the P and N doped regions shown in FIG. 2. In addition, the structure shown in FIG. 4 includes a medium energy p-doped (MP) region 402 as the resistor 224 and includes an N-type well (N-well) 404 as the body of the P-channel MOSFET. Further the structure includes a first drain region 406, which is similar to the first drain 302 shown in FIG. 3, yet with opposite doping polarity. Thus, some embodiments include a shallow well region below the first drain region. The shallow well region has the same doping polarity type as the lateral drain region and the first drain region. An opposite doped well region is positioned below the shallow well region. As the name suggests, the opposite doped well region has an opposite doping polarity type when compared to the lateral drain region. A deep-well region (which is sometimes referred to herein as a "tub" region) is positioned below the opposite doped well region. The deep-well region has the same doping conductivity type as the lateral drain region. In some embodiments, the lateral drain region is electrically connected to the deep-well region and in these embodiments, the lateral train region actually forms part of a tub contact. Again, the embodiments herein integrate LDMOS deep tub implants into the low voltage CMOS MOSFET structure.

Figure 5:
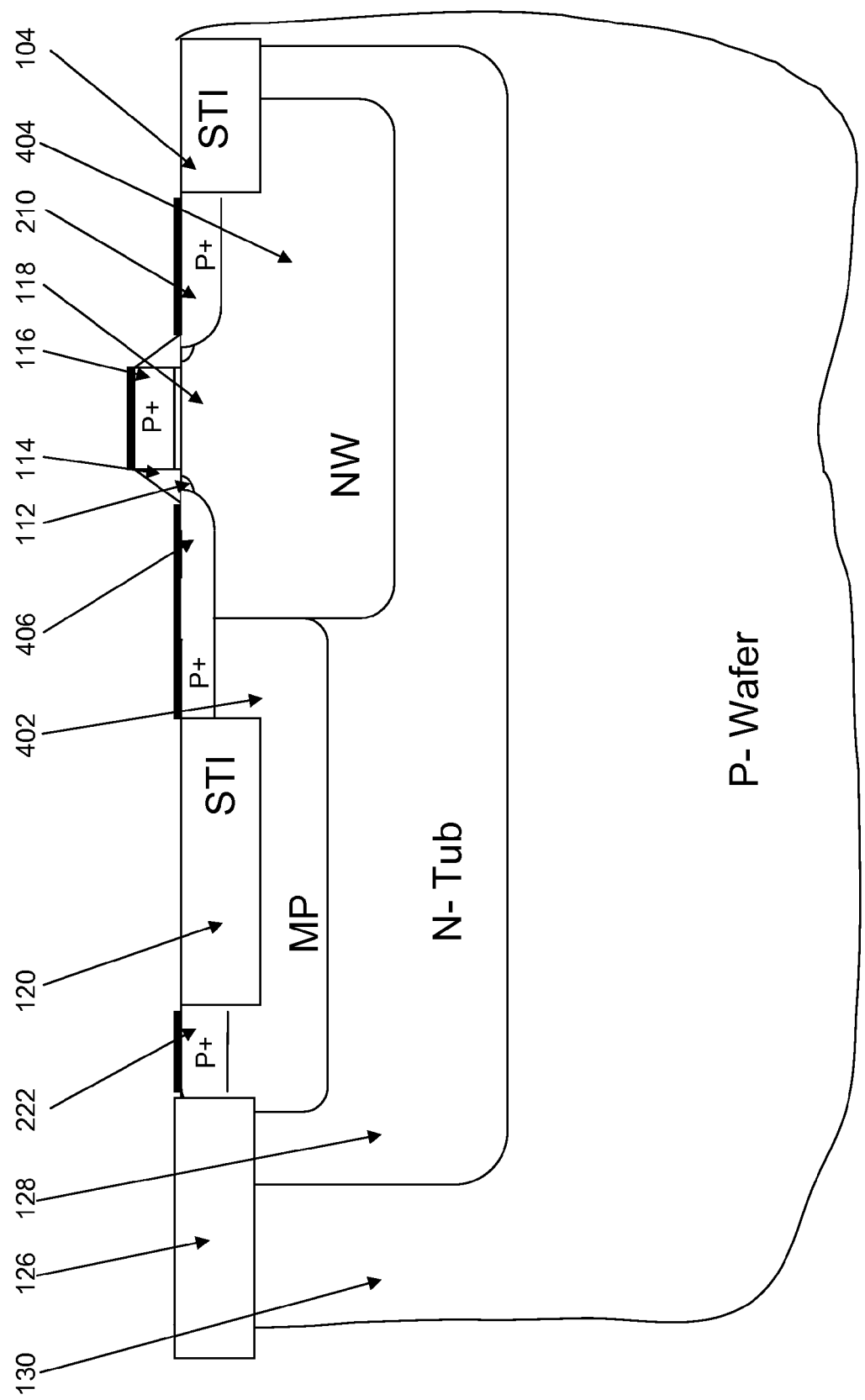
FIG. 5 is schematic diagram of a transistor structure according to embodiments herein.

The structure shown in FIG. 5 is similar to that shown in FIG. 4, except that in FIG. 5 the N-tub 128 is extended to be positioned be isolate the N-well 404 by extending fully beneath and beyond the N-well 404 (as well as fully extending below the MP region 402, as it does in FIG. 4). With the addition of the shallow trench isolation 120, and the p-well region 402, the voltage can be dropped across the LDMOS implant, introducing resistor ballasting and current limitation through the physical structure. The LDMOS well implant region 402 serves as a means of current limitation through the low voltage p-type CMOS device.

Figure 6:
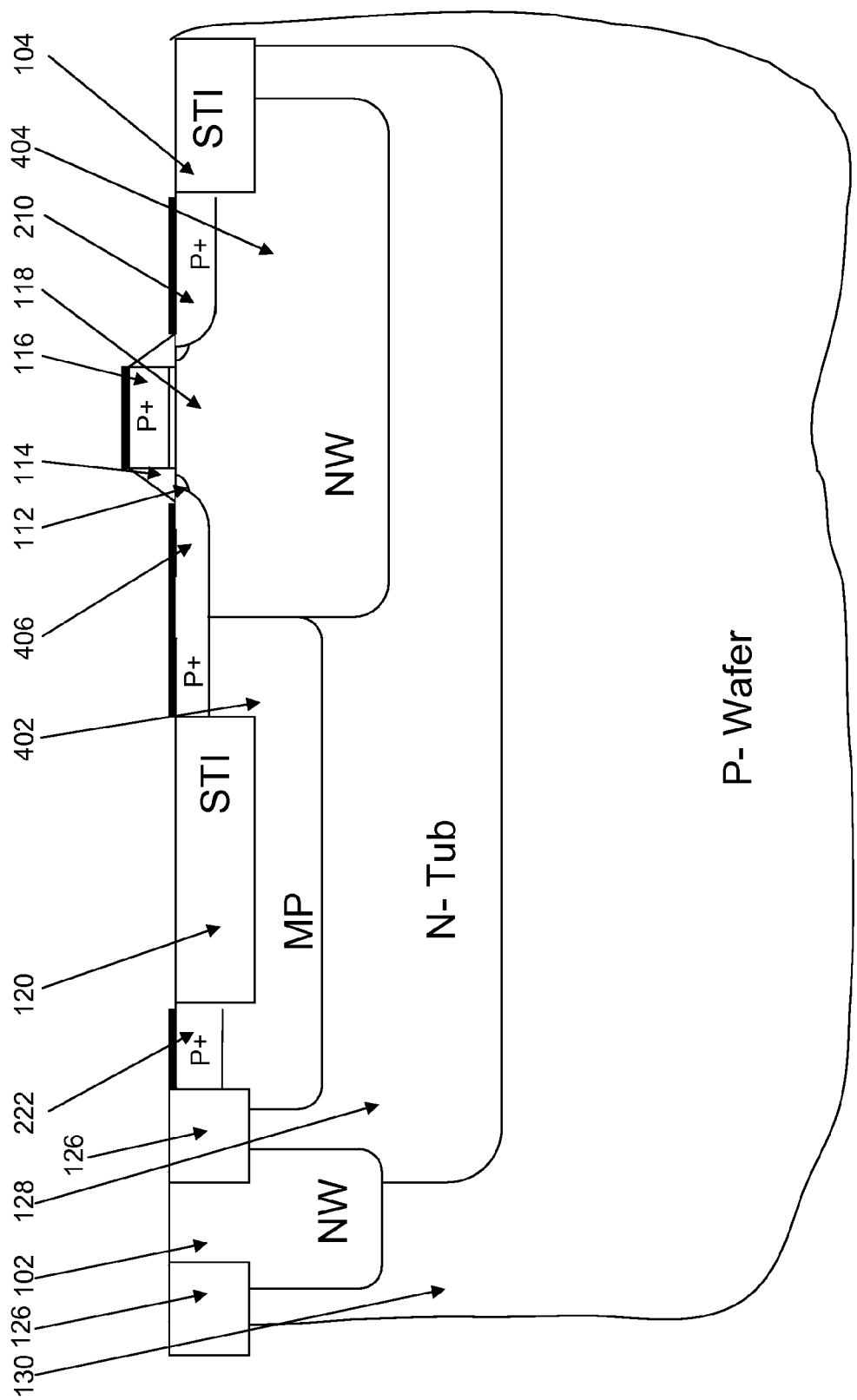
FIG. 6 is schematic diagram of a transistor structure according to embodiments herein.

The structure shown in FIG. 6 adds the N-well 102 (and splits the STI region 126) when compared to the structure shown in FIG. 5. This provides a second contact to the n-well region. With the addition of the shallow trench isolation 120, and the p-well region 402, the voltage can be dropped across the LDMOS implant, introducing resistor ballasting and current limitation through the physical structure. The LDMOS well implant region 402 serves as a means of current limitation through the low voltage p-type CMOS device.

Figure 7:
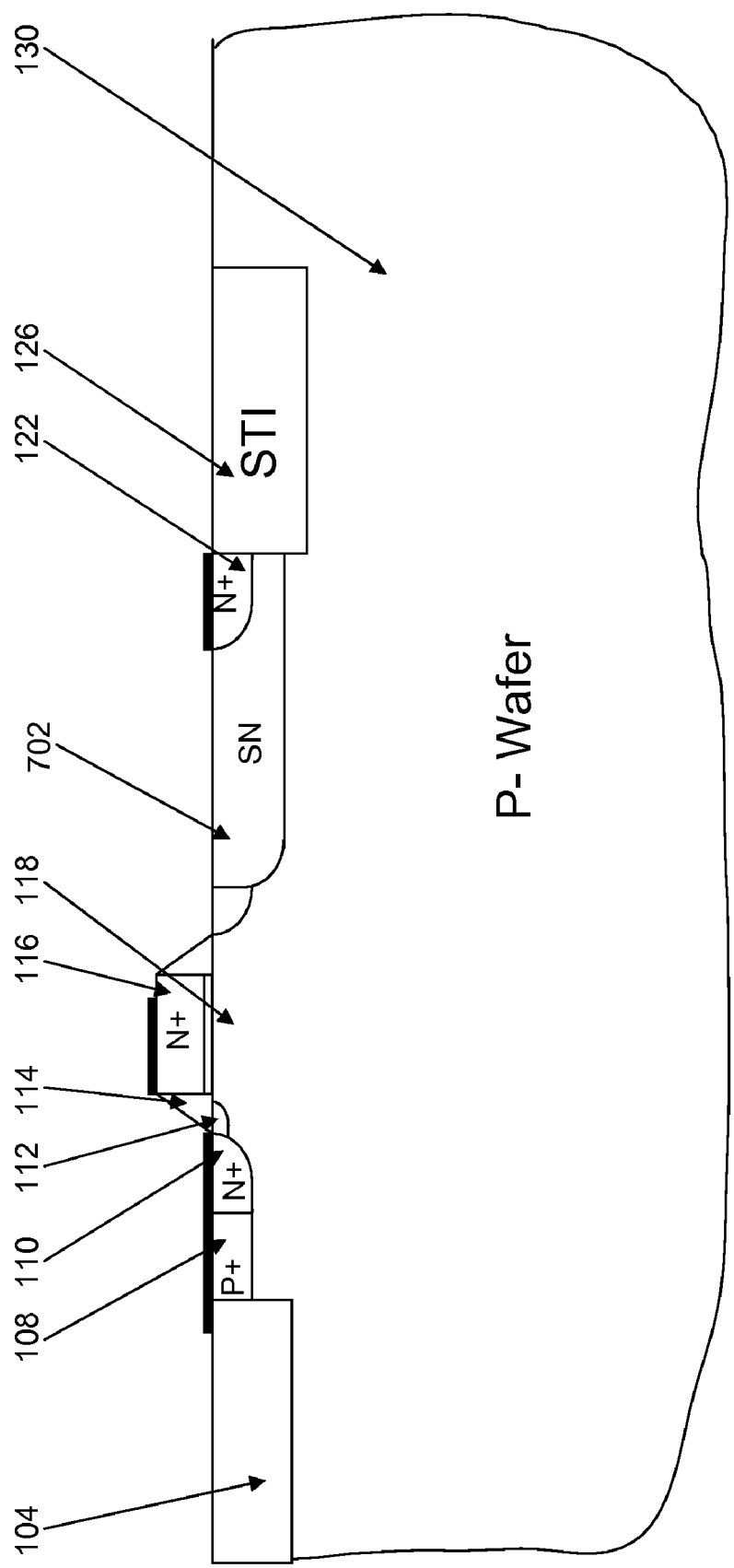
FIG. 7 is schematic diagram of a transistor structure according to embodiments herein.
Figure 8:
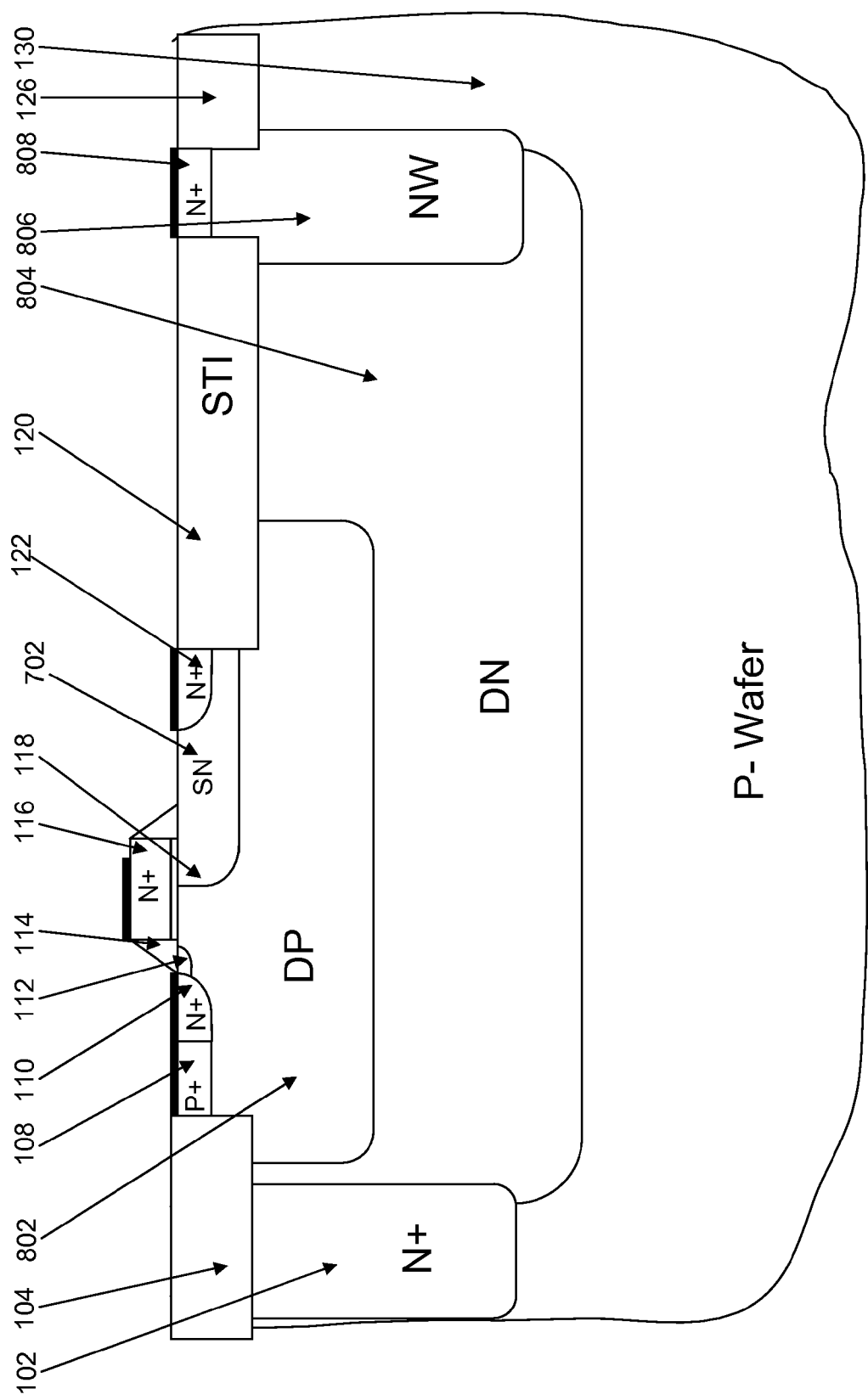
FIG. 8 is schematic diagram of a transistor structure according to embodiments herein.

With an asymmetric field effect transistor, the first drain region 302 is positioned a different distance from the gate conductor 116 than the source region 110 is positioned from the gate conductor 116. This structure, shown in FIG. 7, is an N-type asymmetric medium voltage (MV) ballasted MOSFET that includes many of the same structures discussed above with respect to the structure shown in FIG. 1. However, in FIG. 7, a shallow N-well (SN) region 702 is used as the resistor between the channel region 118 and the lateral drain 122. FIG. 8 is a similar structure to that shown in FIG. 7; however, the structure shown in FIG. 8 includes N-wells 102, 806 positioned at ends of a deep N-type implant region (DN) 804. Within the DN implant region 804, a deep P-type region (DP) 802 underlies the low voltage asymmetric transistor shown in FIG. 7. Thus, the DP region 802, DN region 804, and N-well 806 make up the ballast resistor between the lateral drain 808 (N-tub region) and the FET lower voltage drain 122. In this structure, the SN provides asymmetric current-voltage characteristics allowing more voltage drop across the drain region.

Figure 9:
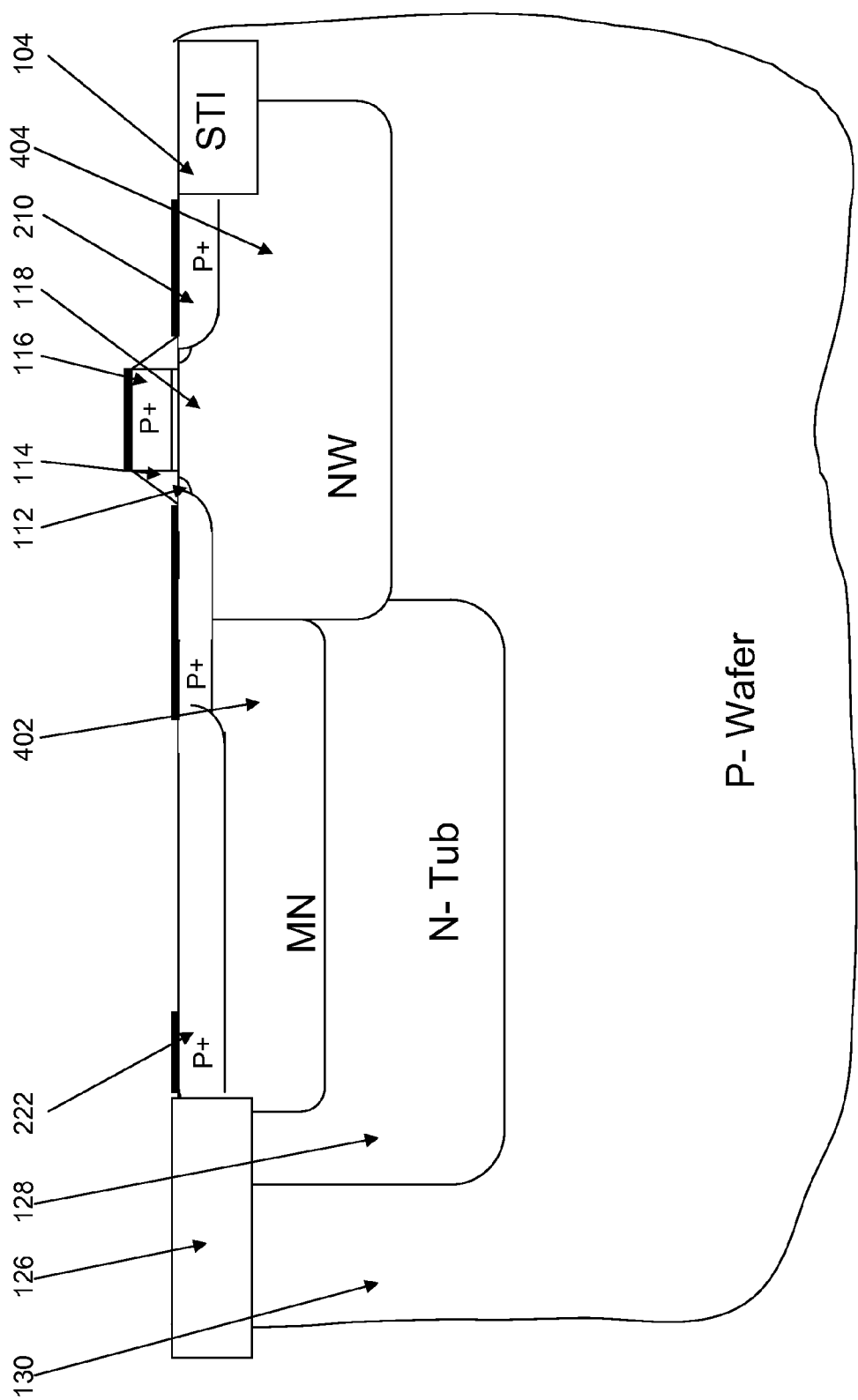
FIG. 9 is schematic diagram of a transistor structure according to embodiments herein.
Figure 10:
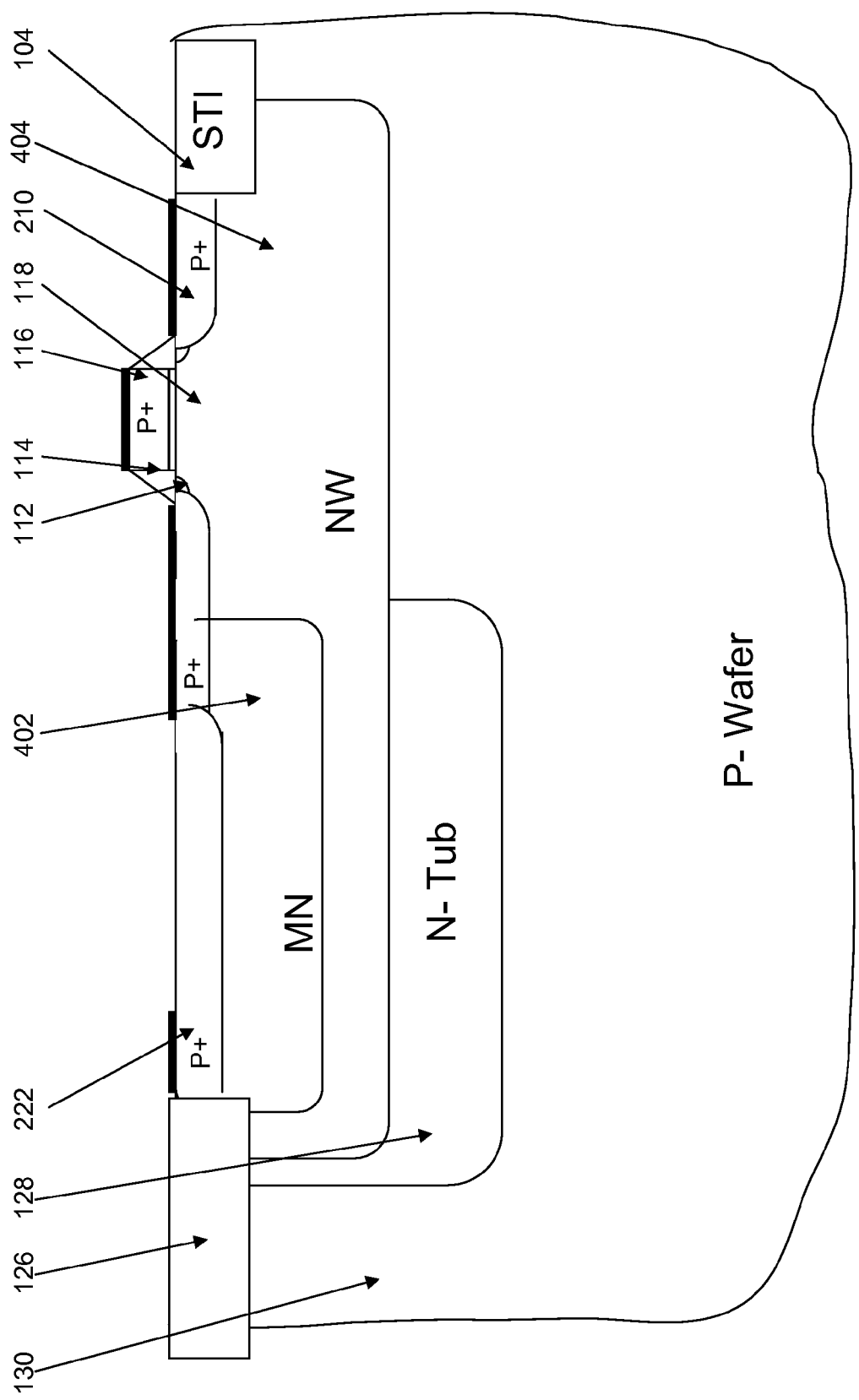
FIG. 10 is schematic diagram of a transistor structure according to embodiments herein.
Figure 11:
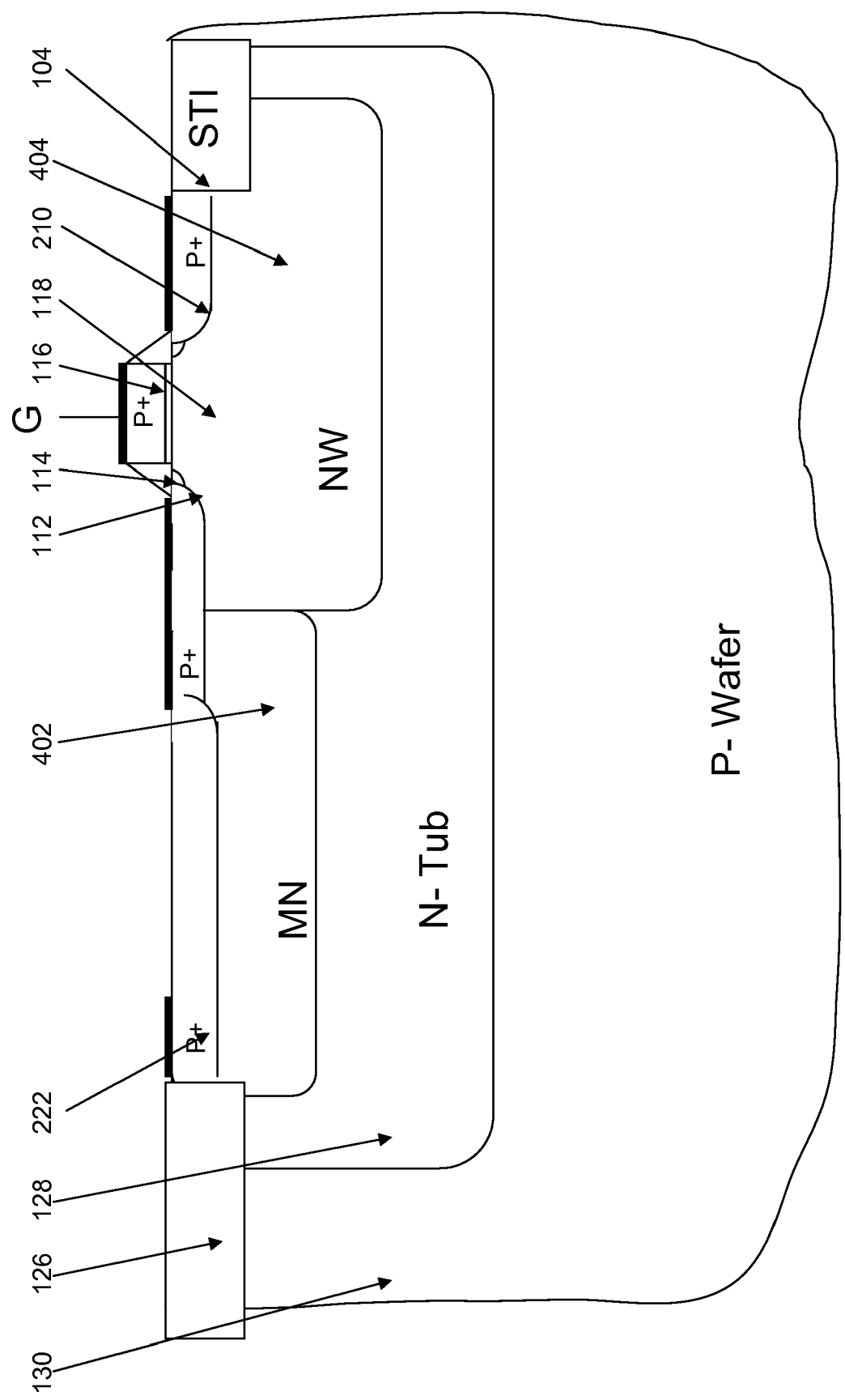
FIG. 11 is schematic diagram of a transistor structure according to embodiments herein.
Figure 12:
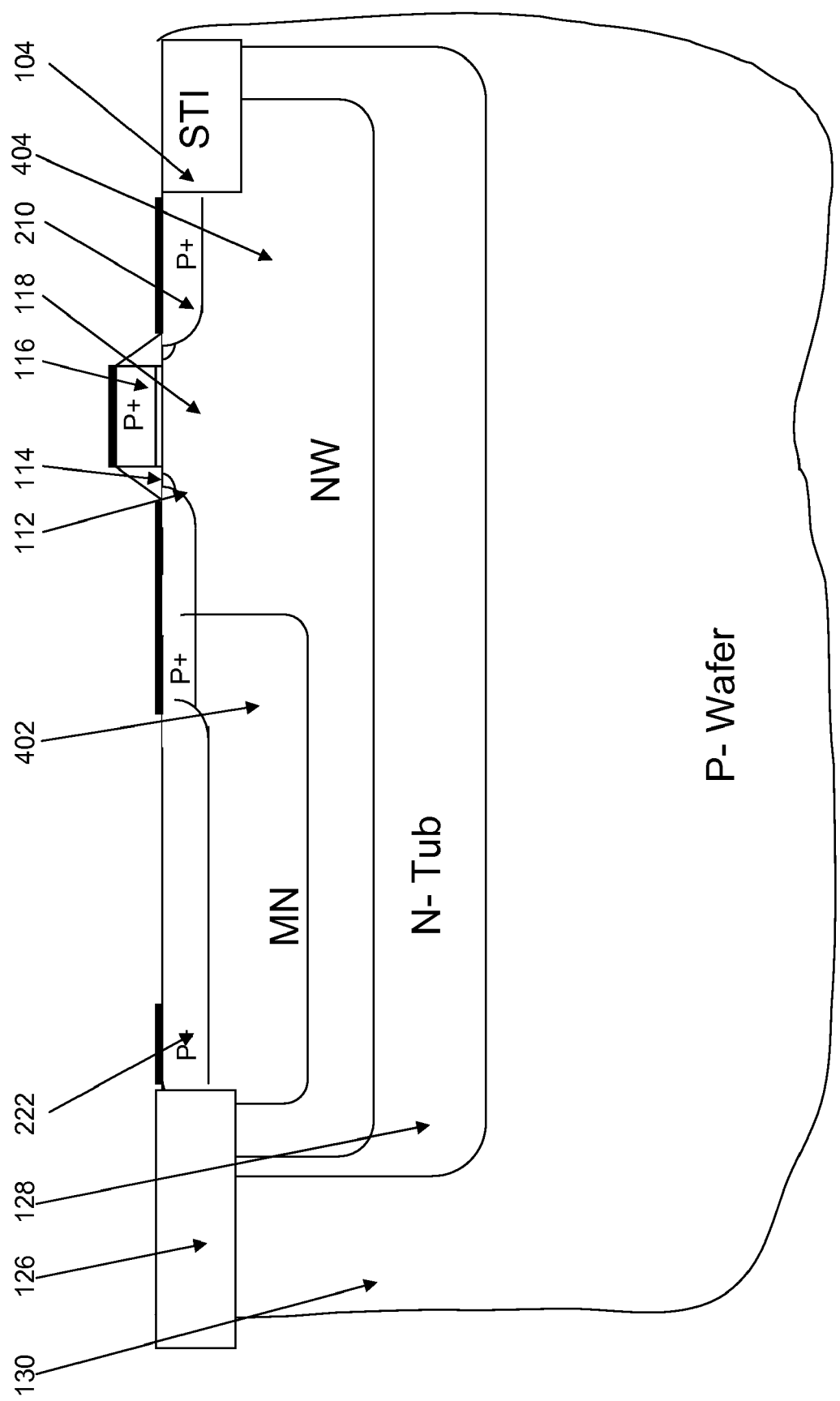
FIG. 12 is schematic diagram of a transistor structure according to embodiments herein.

While FIGS. 7 and 8 illustrate asymmetric N-type embodiments, FIGS. 9-11 illustrate asymmetric P-type embodiments. More specifically, FIG. 9 illustrates a structure that is similar to that shown in FIG. 4, but without the shallow trench isolation region 102. The non-formation of the shallow trench isolation region 102 creates an asymmetric P-type ballasted resistor that utilizes the longer drain 222 that, in combination with the MN region 402, creates the ballast resistor. The structure shown in FIG. 10 is similar to that shown in FIG. 9, except that the N-well 404 is extended to fully surround the bottom and sides of the MN region 402. To the contrary, in the structure shown in FIG. 11, the N-tub region 128 is extended so that it fully surrounds the bottom and sides of the MN region 402 and the N-well 404. In yet another variation, in FIG. 12, both the N-well 404 and the N-tub 128 are extended to the shallow trench isolation regions 104, 126 on either side of the asymmetric transistor, such that the N-tub 128 fully surrounds the sides and bottom of the N-well 404, and the N-well 404 fully surrounds the sides and bottom of the MN region 402. In this structure, the MN provides asymmetric current-voltage characteristics allowing more voltage drop across the drain region. This allows for voltage drop in the p-channel MOSFET drain. The n-tub implant 128 also provides electrical isolation from the well substrate.

Figure 13:
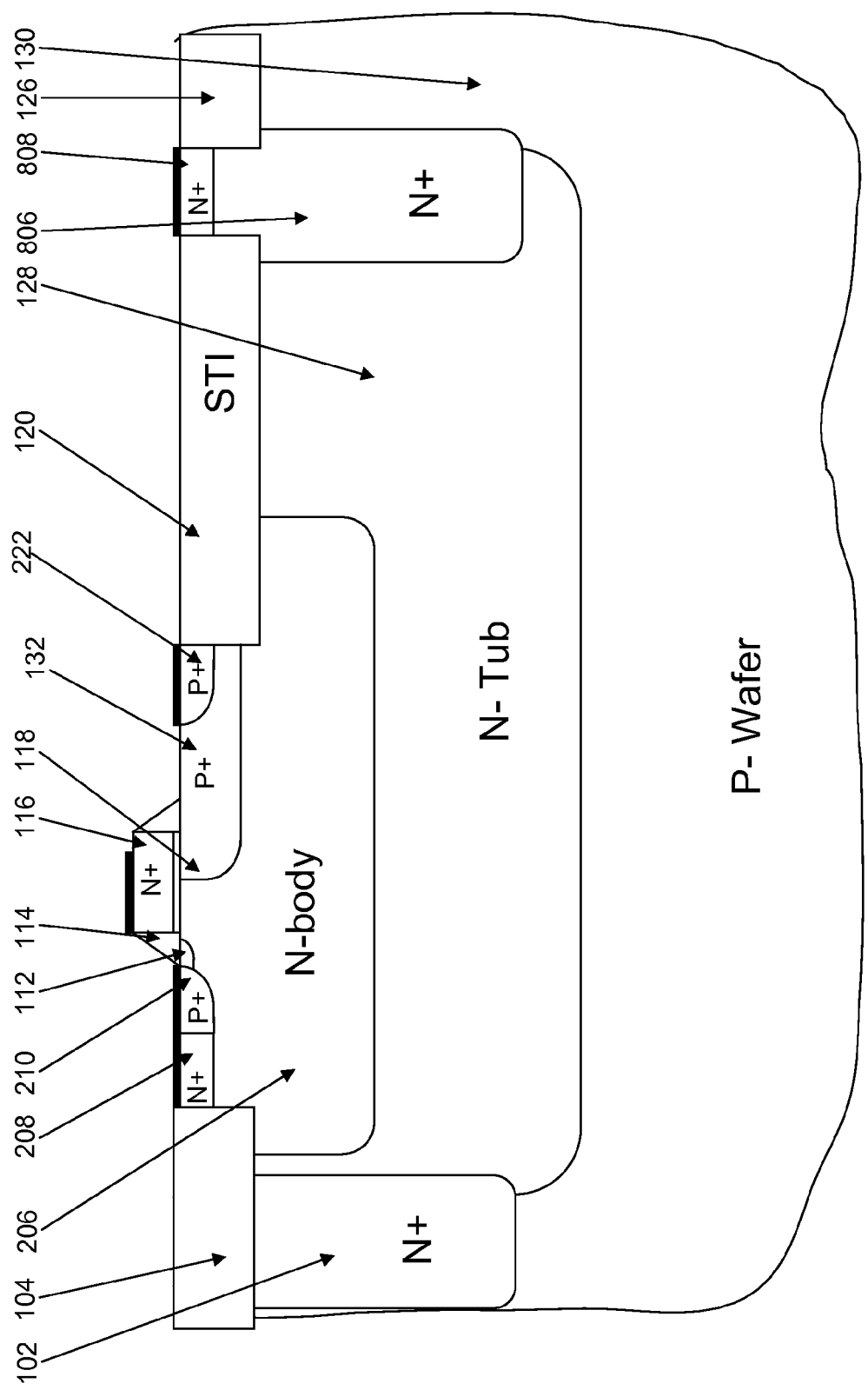
FIG. 13 is schematic diagram of a transistor structure according to embodiments herein.

FIG. 13 illustrates the same structure discussed above with respect to FIG. 8, but in an opposite doping polarity. Therefore, in FIG. 13, the N-doped regions 206 and 208 (from the structure shown in FIG. 2) are utilized, as are the P-doped regions 210 and 222 (again, from FIG. 2); however, a shallow P-doped region 132 is utilized in the embodiment in FIG. 13. Thus, the structure shown in FIG. 13 is similar to that shown in FIG. 8, except with a different polarity.

Figure 14:
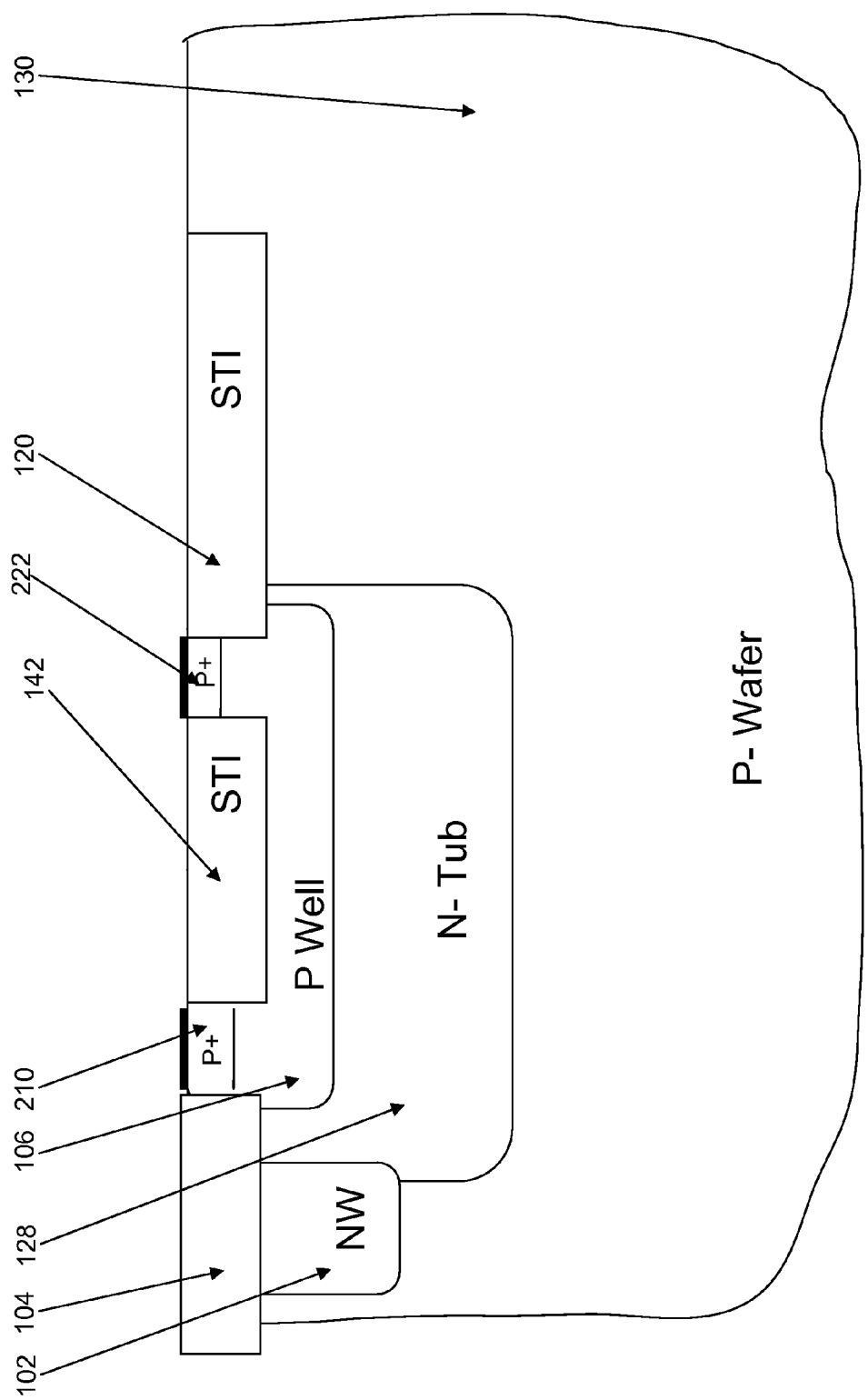
FIG. 14 is schematic diagram of a transistor structure according to embodiments herein.

FIGS. 14 and 15 illustrate ballast resistors separate from any form of transistor. Note that FIGS. 14 and 15 are similar to the P polarity devices discussed above, except that an STI region 142 is included in place of the field effect transistor. FIG. 15 differs from FIG. 14 in that a P-doped region 152 is included between P-doped regions 210 and 222. In concert with this, the N-body 206 is substituted in the structure shown in FIG. 15 for the oppositely doped body in FIG. 14. Further, the N-tub 128 is extended over to the N polarity regions 806, 808 that were used above in FIG. 8. The electrical isolation using the diffused well implants allow for the resistor structures to be raised to high voltages.

Thus, as shown above, the embodiments herein include many different embodiments of a semiconductor device structure for a MOSFET transistor with an integrated ballast or series resistor in the drain terminal. The ballast resistor is constructed using the steps in the process associated with forming LDMOS transistors and is useful in ESD or driver structures.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A semiconductor chip comprising:
   low voltage complementary metal oxide semiconductor (CMOS) sectors and high voltage lateral double diffused metal oxide semiconductor (LDMOS) sectors; and
   a transistor within one of said low voltage CMOS sectors, wherein said transistor comprises:
      a substrate comprising a semiconducting channel region;
      a gate conductor above a top layer of substrate, wherein said gate conductor is positioned above said channel region;
      a source/drain region in said substrate on a first side of said gate conductor;
      a lateral source/drain region in said substrate on a second side of said gate conductor opposite said first side, wherein said lateral source/drain region is positioned a greater distance from said gate conductor than said lateral source/drain region is positioned from said gate conductor; and
      a source/drain ballast resistor comprising LDMOS type implants in said substrate between said lateral source/drain region and said gate conductor.

2. The structure according to claim 1, wherein said source/drain ballast resistor comprises a body region having a same doping polarity type as said lateral source/drain region.

3. The structure according to claim 1, wherein said source/drain ballast resistor electrically connects said lateral source/drain region and said channel region.

4. The structure according to claim 1, further comprising a first source/drain region in said substrate on said second side of said gate conductor,
   wherein said source/drain ballast resistor electrically connects said lateral source/drain region to said first source/drain region.

5. The structure according to claim 4, further comprising a shallow trench isolation region between said lateral source/drain region and said first source/drain region.

6. The structure according to claim 4, wherein said gate conductor, said channel region, said source/drain region, and said first source/drain region comprise one of:
   a symmetric field effect transistor such that said first source/drain region is positioned the same distance from said gate conductor as said source/drain region is positioned from said gate conductor; and
   an asymmetric field effect transistor such that said first source/drain region is positioned a different distance from said gate conductor than said source/drain region is positioned from said gate conductor.

7. The structure according to claim 4, further comprising:
   a shallow well region below said first source/drain region, wherein said shallow well region has a same doping polarity type as said lateral source/drain region and said first source/drain region;
   an opposite doped well region below said shallow well region, wherein said opposite doped well region has an opposite doping polarity type as said lateral source/drain region,
   a tub region below said opposite doped well region, wherein said tub region has a same doping conductivity type as said lateral source/drain region, and
   wherein said lateral source/drain region is electrically connected to said tub region.

8. A semiconductor chip comprising:
low voltage complementary metal oxide semiconductor (CMOS) sectors and high voltage lateral double diffused metal oxide semiconductor (LDMOS) sectors; and
a transistor within one of said low voltage CMOS sectors, wherein said transistor comprises:
a substrate comprising a semiconducting channel region;
a gate conductor above a top layer of substrate, wherein said gate conductor is positioned above said channel region;
a source/drain region in said substrate on a first side of said gate conductor;
a lateral source/drain region in said substrate on a second side of said gate conductor opposite said first side, wherein said lateral source/drain region is positioned a greater distance from said gate conductor than said lateral source/drain region is positioned from said gate conductor;
a source/drain ballast resistor in said substrate between said lateral source/drain region and said gate conductor;
a shallow well region below said first source/drain region, wherein said shallow well region has a same doping polarity type as said lateral source/drain region and said first source/drain region; and
a tub region below said opposite doped well region, wherein said tub region has a same doping conductivity type as said lateral source/drain region, and wherein said tub region comprises LDMOS type implants.

9. The structure according to claim 8, wherein said source/drain ballast resistor comprises a body region having a same doping polarity type as said lateral source/drain region.

10. The structure according to claim 8, wherein said source/drain ballast resistor electrically connects said lateral source/drain region and said channel region.

11. The structure according to claim 8, further comprising a first source/drain region in said substrate on said second side of said gate conductor,
wherein said source/drain ballast resistor electrically connects said lateral source/drain region to said first source/drain region.

12. The structure according to claim 11, further comprising a shallow trench isolation region between said lateral source/drain region and said first source/drain region.

13. The structure according to claim 11, wherein said gate conductor, said channel region, said source/drain region, and said first source/drain region comprise one of:
a symmetric field effect transistor such that said first source/drain region is positioned the same distance from said gate conductor as said source/drain region is positioned from said gate conductor; and
an asymmetric field effect transistor such that said first source/drain region is positioned a different distance from said gate conductor than said source/drain region is positioned from said gate conductor.

14. The structure according to claim 11, wherein said lateral source/drain region is electrically connected to said tub region.

15. A semiconductor chip comprising:
low voltage complementary metal oxide semiconductor (CMOS) sectors and high voltage lateral double diffused metal oxide semiconductor (LDMOS) sectors; and
a transistor within one of said low voltage CMOS sectors, wherein said transistor comprises:
a substrate comprising a semiconducting channel region;
an N-type gate conductor above a top layer of substrate, wherein said N-type gate conductor is positioned above said channel region;
an N-type source/drain region in said substrate on a first side of said N-type gate conductor;
an N-type lateral source/drain region in said substrate on a second side of said N-type gate conductor opposite said first side, wherein said N-type lateral source/drain region is positioned a greater distance from said N-type gate conductor than said N-type source/drain region is positioned from said N-type gate conductor; and
an N-type lateral source/drain ballast resistor comprising LDMOS type implants in said substrate between said N-type lateral source/drain region and said N-type gate conductor.

16. The structure according to claim 15, wherein said N-type source/drain ballast resistor comprises an N-type body region.

17. The structure according to claim 15, wherein said N-type source/drain ballast resistor electrically connects said N-type lateral source/drain region and said channel region.

18. The structure according to claim 15, further comprising a first N-type source/drain region in said substrate on said second side of said N-type gate conductor,
wherein said N-type source/drain ballast resistor electrically connects said N-type lateral source/drain region to said first N-type source/drain region.

19. The structure according to claim 18, further comprising a shallow trench isolation region between said N-type lateral source/drain region and said first N-type source/drain region.

20. The structure according to claim 18, wherein said N-type gate conductor, said channel region, said N-type source/drain region, and said first N-type source/drain region comprise one of:
a symmetric field effect transistor such that said first N-type source/drain region is positioned the same distance from said N-type gate conductor as said N-type source/drain region is positioned from said N-type gate conductor; and
an asymmetric field effect transistor such that said first N-type source/drain region is positioned a different distance from said N-type gate conductor than said N-type source/drain region is positioned from said N-type gate conductor.

* * * * *